(12) United States Patent
Xiang et al.

(10) Patent No.: US 12,088,269 B2
(45) Date of Patent: Sep. 10, 2024

(54) METHOD, DEVICE, AND STORAGE MEDIUM FOR HYBRID AUTOMATIC GAIN CONTROL IN COMMUNICATION SYSTEM

(71) Applicant: Intelligent Fusion Technology, Inc., Germantown, MD (US)

(72) Inventors: Xingyu Xiang, Germantown, MD (US); Dan Shen, Germantown, MD (US); Genshe Chen, Germantown, MD (US); Khanh Pham, Kirtland AFB, NM (US)

(73) Assignee: Intelligent Fusion Technology, Inc., Germantown, MD (US)

( * ) Notice: Subject to any disclaimer, the term of this patent is extended or adjusted under 35 U.S.C. 154(b) by 322 days.

(21) Appl. No.: 17/382,838

(22) Filed: Jul. 22, 2021

(65) Prior Publication Data

US 2022/0029594 A1 Jan. 27, 2022

Related U.S. Application Data

(60) Provisional application No. 63/085,826, filed on Sep. 30, 2020, provisional application No. 63/055,092, filed on Jul. 22, 2020.

(51) Int. Cl.
*H03G 3/30* (2006.01)
*H03F 3/21* (2006.01)

(52) U.S. Cl.
CPC ............. *H03G 3/3089* (2013.01); *H03F 3/21* (2013.01); *H03G 2201/103* (2013.01)

(58) Field of Classification Search
CPC ........... H03G 3/3089; H03G 2201/103; H03G 2201/706; H03G 3/3078; H03G 3/3052; H03G 1/0088; H03G 1/0023; H03G 3/3042; H03G 3/3036; H03G 3/001; H03F 3/21; H04B 1/1027; H04L 27/3809
USPC .................................................. 330/278, 279
See application file for complete search history.

(56) References Cited

U.S. PATENT DOCUMENTS

| | | | | |
|---|---|---|---|---|
| 7,805,121 B2* | 9/2010 | Kimura | ................ | H03G 3/3078 375/345 |
| 8,660,509 B2* | 2/2014 | Watanabe | ........... | H04W 56/001 455/238.1 |
| 9,049,081 B2* | 6/2015 | Taniguchi | ............ | H03G 3/3078 |
| 9,059,671 B2* | 6/2015 | Ito | ............................ | H03G 3/20 |

\* cited by examiner

*Primary Examiner* — Khanh V Nguyen
(74) *Attorney, Agent, or Firm* — ANOVA LAW GROUP, PLLC

(57) ABSTRACT

Embodiments of the present disclosure provide a method, a device, and a storage medium for hybrid automatic gain control in a communication system. The method includes amplifying an input signal to generate an amplified signal which is converted into a plurality of output signals; obtaining a moving average amplitude of a plurality of output signals of a current input signal; and calculating a signal amplitude difference according to the moving average amplitude and a desired output signal amplitude level; calculating a signal amplitude ratio according to a plurality of output signals of two previous output signal blocks and AGC gains corresponding to the plurality of output signals of the two previous output signal blocks; obtaining a step size according to the signal amplitude difference and the signal amplitude ratio; and calculating an AGC gain of the current input signal according to the step size and a corresponding previous AGC gain.

15 Claims, 8 Drawing Sheets

METHOD, DEVICE, AND STORAGE MEDIUM FOR HYBRID AUTOMATIC GAIN CONTROL IN COMMUNICATION SYSTEM

CROSS-REFERENCE TO RELATED APPLICATION

This application claims the priority of U.S. Provisional Application No. 63/055,092, filed on Jul. 22, 2020, and No. 63/085,826, filed on Sep. 30, 2020, the content of all of which is incorporated herein by reference in its entirety.

GOVERNMENT RIGHTS

The present disclosure was made with Government support under Contract No. FA9453-19-P-0555, awarded by the United States Air Force Research Laboratory. The U.S. Government has certain rights in the present disclosure.

FIELD OF THE DISCLOSURE

The present disclosure generally relates to the field of communication technology and, more particularly, relates to a method, a device, and a storage medium for hybrid automatic gain control in a communication system.

BACKGROUND

In satellite communication systems, a received signal may have an unpredictable signal power and vary over a wide dynamic range caused by multi-carrier signals and unwanted signals such as strong interferer signals. Current satellite receiver systems may use an automatic gain control (AGC) loop with a fixed time constant, which may perform well with non-frequency hopping signals in a normal environment without jamming. AGC is an important component in the communication system, and a feedback loop AGC has better loop stability compared with a feedforward loop AGC at the cost of larger system complexity and settling time. The conventional AGC loop can deal with slow signal amplitude fluctuations caused by regular noises or interfaces. When a frequency hopping method is applied in a satellite communication system for the purpose of anti-jamming, the corresponding signal amplitude may fluctuate quickly as the signal carrier frequency hops among frequency points which are not close to one another. Therefore, a smart AGC loop may be necessary to track communication signals' quick fluctuating amplitudes generated by a frequency hopping spread spectrum, and the gain of the AGC may be dynamically adjusted based on the incoming signal to extend the dynamic range by preventing the quantization error or saturation at an ADC (analog-to-digital converter). Besides, the AGC may also maintain the gain of a high-power amplifier (HPA) to avoid operating at saturation. In order to meet requirements for developing the satellite communication system and tackle the challenge of quick fluctuating amplitudes in frequency hopping signals, there is a need to develop a new hybrid AGC method (i.e., approach), which may not only effectively increase the convergence speed of the AGC but also maintain the AGC stability.

BRIEF SUMMARY OF THE DISCLOSURE

One aspect or embodiment of the present disclosure provides a hybrid automatic gain control (AGC) method. The method includes amplifying, by a variable gain amplifier, an input signal received from a transmitter to generate an amplified signal, and converting the amplified signal into a plurality of output signals; obtaining, by an average amplitude estimator, a moving average amplitude of a plurality of output signals of a current input signal; and calculating, by a signal amplitude difference calculator, a signal amplitude difference according to the moving average amplitude of the plurality of output signals of the current input signal and a desired output signal amplitude level; calculating, by a normalized signal amplitude ratio calculator, a signal amplitude ratio according to a plurality of output signals of two previous output signal blocks and AGC gains corresponding to the plurality of output signals of the two previous output signal blocks, where the two previous output signal blocks correspond to two previous consecutive input signals together next to the current input signal; obtaining a step size according to the signal amplitude difference and the signal amplitude ratio; and calculating an AGC gain of the current input signal according to the step size and a corresponding previous AGC gain.

Optionally, the signal amplitude difference is expressed by:

$$A_e = A_n - A_d$$

where $A_e$ denotes the signal amplitude difference, $A_n$ denotes the moving average amplitude and $A_d$ denotes the desired output signal amplitude level.

Optionally, the signal amplitude ratio is expressed by:

$$S_p = \sum_{i=1}^{\beta} \left| \frac{\hat{y}_{n-\beta-i}}{G_{n-\beta-i}} \right| / \sum_{i=1}^{\beta} \left| \frac{\hat{y}_{n-i}}{G_{n-i}} \right|$$

where $S_p$ denotes the signal amplitude ratio, $\hat{y}$ denotes an output signal, G denotes an AGC gain, n denotes a signal index, $\beta$ denotes a size of an output signal block, and i denotes an index within the output signal block.

Optionally, the step size is expressed by:

$$S_a = \frac{A_e}{1 + e^{-|\lambda S_p|}}$$

where $S_a$ denotes the step size, and $\lambda$ denotes a scale factor.

Optionally, the size of the output signal block is an integral multiple of a quantity of the plurality of output signals of the current input signal.

Optionally, an analog-to-digital converter is configured to convert the amplified signal into the plurality of output signals.

Another aspect or embodiment of the present disclosure provides a hybrid automatic gain control (AGC) device. The device includes a memory, configured to store program instructions for performing a hybrid automatic gain control method; and a processor, coupled with the memory and, when executing the program instructions, configured for: amplifying, by a variable gain amplifier, an input signal received from a transmitter to generate an amplified signal, and converting the amplified signal into a plurality of output signals; obtaining, by an average amplitude estimator, a moving average amplitude of a plurality of output signals of a current input signal; and calculating, by a signal amplitude difference calculator, a signal amplitude difference according to the moving average amplitude of the plurality of output signals of the current input signal and a desired output signal amplitude level; calculating, by a normalized signal amplitude ratio calculator, a signal amplitude ratio according to a plurality of output signals of two previous output signal blocks and AGC gains corresponding to the plurality of output signals of the two previous output signal blocks, where the two previous output signal blocks correspond to two previous consecutive input signals together next to the current input signal; obtaining a step size according to the signal amplitude difference and the signal amplitude ratio; and calculating an AGC gain of the current input signal according to the step size and a corresponding previous AGC gain.

Optionally, the signal amplitude difference is expressed by:

$$A_e = A_n - A_d$$

where $A_e$ denotes the signal amplitude difference, $A_n$ denotes the moving average amplitude and $A_d$ denotes the desired output signal amplitude level.

Optionally, the signal amplitude ratio is expressed by:

$$s_p = \sum_{i=1}^{\beta} \left|\frac{\hat{y}_{n-\beta-i}}{G_{n-\beta-i}}\right| / \sum_{i=1}^{\beta} \left|\frac{\hat{y}_{n-i}}{G_{n-i}}\right|$$

where $S_p$ denotes the signal amplitude ratio, ŷ denotes an output signal, G denotes an AGC gain, n denotes a signal index, β denotes a size of an output signal block, and i denotes an index within the output signal block.

Optionally, the step size is expressed by:

$$S_a = \frac{A_e}{1 + e^{-|\lambda S p|}}$$

where $S_a$ denotes the step size, and λ denotes a scale factor.

Optionally, the size of the output signal block is an integral multiple of a quantity of the plurality of output signals of the current input signal.

Optionally, an analog-to-digital converter is configured to convert the amplified signal into the plurality of output signals.

Another aspect or embodiment of the present disclosure provides a non-transitory computer-readable storage medium, containing program instructions for, when being executed by a processor, performing a hybrid automatic gain control (AGC) method, the method including: amplifying, by a variable gain amplifier, an input signal received from a transmitter to generate an amplified signal, and converting the amplified signal into a plurality of output signals; obtaining, by an average amplitude estimator, a moving average amplitude of a plurality of output signals of a current input signal; and calculating, by a signal amplitude difference calculator, a signal amplitude difference according to the moving average amplitude of the plurality of output signals of the current input signal and a desired output signal amplitude level; calculating, by a normalized signal amplitude ratio calculator, a signal amplitude ratio according to a plurality of output signals of two previous output signal blocks and AGC gains corresponding to the plurality of output signals of the two previous output signal blocks, where the two previous output signal blocks correspond to two previous consecutive input signals together next to the current input signal; obtaining a step size according to the signal amplitude difference and the signal amplitude ratio; and calculating an AGC gain of the current input signal according to the step size and a corresponding previous AGC gain.

Optionally, the signal amplitude difference is expressed by:

$$A_e = A_n - A_d$$

where $A_e$ denotes the signal amplitude difference, $A_n$ denotes the moving average amplitude and $A_d$ denotes the desired output signal amplitude level.

Optionally, the signal amplitude ratio is expressed by:

$$s_p = \sum_{i=1}^{\beta} \left|\frac{\hat{y}_{n-\beta-i}}{G_{n-\beta-i}}\right| / \sum_{i=1}^{\beta} \left|\frac{\hat{y}_{n-i}}{G_{n-i}}\right|$$

where $S_p$ denotes the signal amplitude ratio, ŷ denotes an output signal, G denotes an AGC gain, n denotes a signal index, β denotes a size of an output signal block, and i denotes an index within the output signal block.

Optionally, the step size is expressed by:

$$S_a = \frac{A_e}{1 + e^{-|\lambda S p|}}$$

where $S_a$ denotes the step size, and λ denotes a scale factor.

Optionally, the size of the output signal block is an integral multiple of a quantity of the plurality of output signals of the current input signal.

Optionally, an analog-to-digital converter is configured to convert the amplified signal into the plurality of output signals.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

References may be made in detail to exemplary embodiments of the disclosure hereinafter, which are illustrated in the accompanying drawings. Wherever possible, same reference numbers may be used throughout the drawings to refer to same or similar parts.

These embodiments are described in sufficient detail to enable those skilled in the art to practice the disclosure; and it should be understood that other embodiments may be used, and modifications or changes may be made without departing from the scope of the disclosure. The following description is, therefore, merely exemplary.

Various embodiments of the present disclosure provide a method, a device, and a storage medium for hybrid automatic gain control (AGC) in a communication (e.g., satellite) system.

Figure 1:
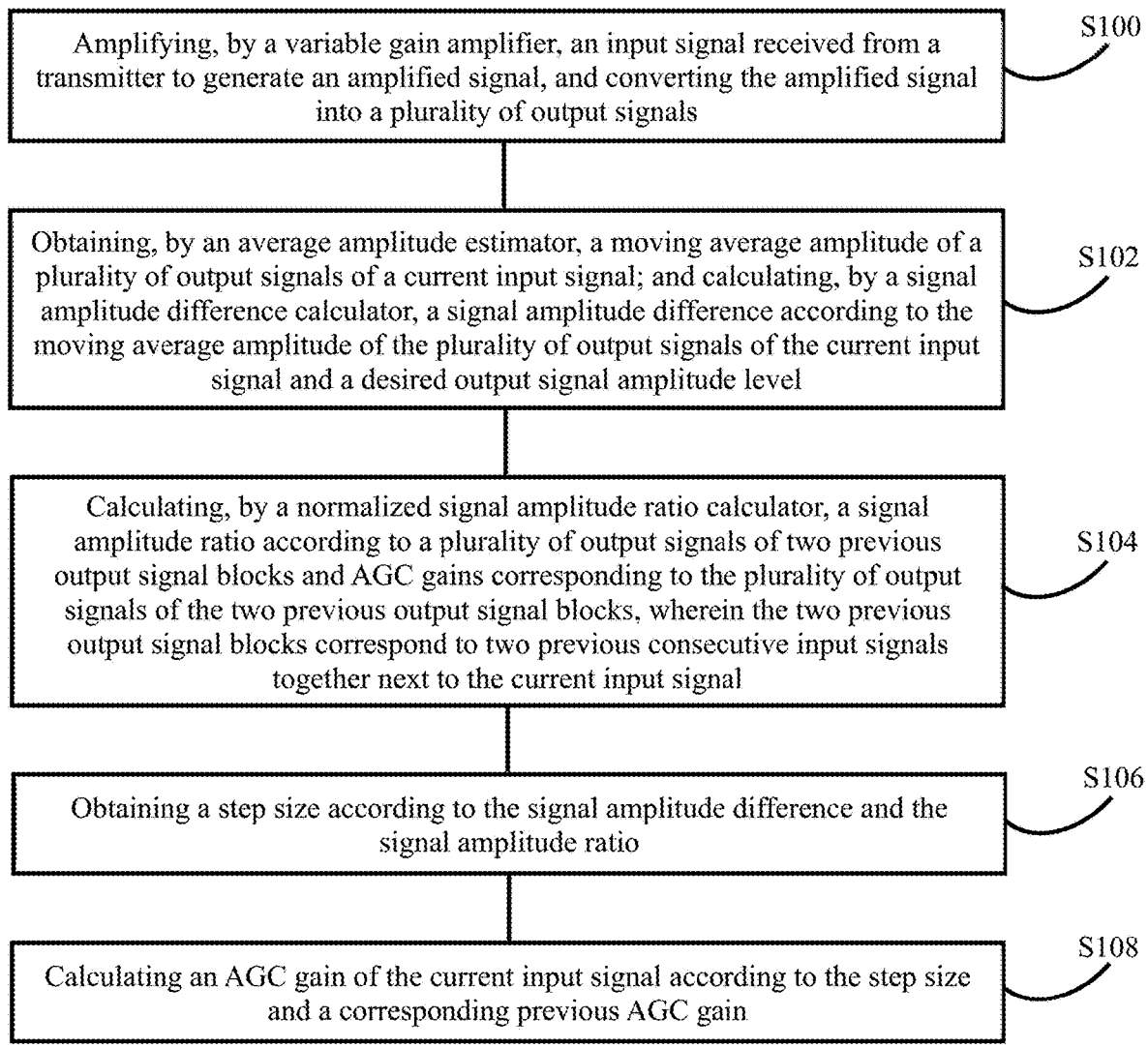
FIG. 1 depicts a flowchart of an exemplary hybrid automatic gain control (AGC) method according to various disclosed embodiments of the present disclosure.

FIG. 1 depicts a flowchart of an exemplary hybrid AGC method according to various disclosed embodiments of the present disclosure. The hybrid AGC method for a communication system may be described hereinafter. According to various disclosed embodiments, the method may include the following steps.

In S100, an input signal received from a transmitter may be amplified, by a variable gain amplifier, to generate an amplified signal, and the amplified signal may be converted into a plurality of output signals.

In S102, a moving average amplitude of a plurality of output signals of a current input signal may be obtained by an average amplitude estimator; and a signal amplitude difference may be calculated, by a signal amplitude difference calculator, according to the moving average amplitude of the plurality of output signals of the current input signal and a desired output signal amplitude level.

In S104, a signal amplitude ratio may be calculated, by a normalized signal amplitude ratio calculator, according to a plurality of output signals of two previous output signal blocks and AGC gains corresponding to the plurality of output signals of the two previous output signal blocks, where the two previous output signal blocks correspond to two previous consecutive input signals together next to the current input signal.

In S106, a step size may be obtained according to the signal amplitude difference and the signal amplitude ratio.

In S108, an AGC gain of the current input signal may be calculated according to the step size and a corresponding previous AGC gain.

Figure 2:
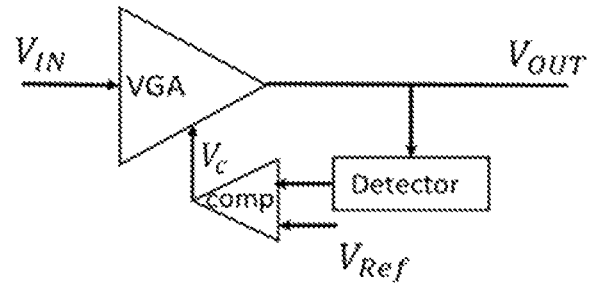
FIG. 2 depicts an exemplary feedback automatic gain control in the existing technology.

FIG. 2 depicts an exemplary feedback AGC in the existing technology. Referring to FIG. 2, the structure of a typical feedback AGC (normally on a receiver side) may be illustrated. A input signal $V_{IN}$ may be amplified by a variable gain amplifier (VGA), whose gain is controlled by a signal $V_C$. In order to adjust the VGA gain to its optimal level of an output signal $V_{OUT}$, the AGC may detect the strength level of the output signal using the amplitude detector at first; then such level may be compared with a reference voltage $V_{REF}$; finally, a required control voltage may be filtered and generated. The above-mentioned function may be performed by detecting the signal at the output of the VGA ("feedback" AGC) or at the input ("feedforward" AGC).

For the conventional feedback AGC, the value of the gain that is applied on the input signal $V_{IN}$ may be determined by changing a previous gain with a different step size $S_i$. Different step sizes may be defined in a look-up-table (LUT) which contains a sequence of reference amplitudes corresponding to the step sizes. The amplitude of the input signal may be first estimated by an amplitude detector and then compared with the reference amplitudes in the LUT. The selected step size may correspond to the reference amplitude with the input signal minimum difference. Since the maximum change of the gain is only determined by the maximum step size defined in the LUT, the conventional feedback AGC scheme may have limited response time even when the input signal amplitude (i.e., power) level contains large and rapid variations. Although increasing the step size permits the AGC to respond more quickly to input signal power changes, the variation in the output signal amplitude level during the steady-state operation may also increase.

In various embodiments of the present disclosure, the step size may be adaptively selected according to the variations of the input signal amplitude level to improve the response time and maintain low variations in the output signal during the steady-state operation. In order to adaptively determine the step size of the gain, a hybrid AGC method combining the signal amplitude ratio and the signal amplitude difference is provided in various embodiments of the present disclosure.

The signal amplitude difference $A_e$ may refer to the difference between a moving average amplitude of a plurality of output signals and a desired output signal amplitude level:

$$A_e = A_n - A_d \qquad (1)$$

where $A_n$ denotes the moving average amplitude of the plurality of output signals, and $A_d$ denotes the desired output signal amplitude level.

The signal amplitude difference $A_e$ may not be directly used as the step size as it generates large variations on the output signal amplitude level during each AGC loop operation.

In various embodiments provided in the present disclosure, the signal amplitude ratio may determine the ratio of the signal amplitude difference that used to be the step size. The signal amplitude ratio $S_p$ may be calculated as follows:

$$S_p = \sum_{i=1}^{\beta} \left| \frac{\hat{y}_{n-\beta-i}}{G_{n-\beta-i}} \right| \bigg/ \sum_{i=1}^{\beta} \left| \frac{\hat{y}_{n-i}}{G_{n-i}} \right| \qquad (2)$$

where $\hat{y}$ denotes an output signal after ADC (analog-to-digital converter), G denotes an AGC gain, n denotes a signal index, $\beta$ denotes a size of an output signal block, and i denotes an index within the output signal block. According to various embodiments of the present disclosure, for example, the signal amplitude ratio $S_p$ may be computed based on two previous output signal blocks (e.g., the first block and the second block) and their corresponding gains. The numerator $$\sum_{i=1}^{\beta} \left| \frac{\hat{y}_{n-\beta-i}}{G_{n-\beta-i}} \right|$$

and the denominator $$\sum_{i=1}^{\beta} \left| \frac{\hat{y}_{n-i}}{G_{n-i}} \right|$$

of equation (2) may calculated based on the first block and the second block, respectively. For example, if assuming the block size $\beta$ is 4, the numerator of equation (2) may be calculated based on $\hat{y}_1$-$\hat{y}_4$ and their corresponding gains, and the denominator may be calculated based on $\hat{y}_5$-$\hat{y}_8$ and their corresponding gains. The two previous output signal blocks may correspond to two previous consecutive input signals together next to the current input signal.

Therefore, according to various embodiments of the present disclosure, the adaptive step size $S_a$ may be expressed by:

$$S_a = \frac{A_e}{1 + e^{-|\lambda S_p|}}, \qquad (3)$$

where $\lambda$ is a scale factor. According to the above-mentioned equations, the adaptive step size $S_a$ may be determined based on the signal amplitude ratio $S_p$ and the signal amplitude difference $A_e$. For example, when a large amplitude change occurs in the input signal amplitude level, a relatively large ratio such as 0.8 of the signal amplitude difference may be used as the step size to change the gain. During a steady-state operation, the gain may be adjusted based on the step size which has a relatively small ratio such as 0.1 of the signal amplitude difference. Therefore, the response time of the AGC may be improved with less variations during the steady-state operation.

In some embodiments of the present disclosure, the moving average amplitude of the plurality of output signals of a current input signal may be obtained by the average amplitude estimator. The AGC input may contain a series of input signals y, and the ADC may convert each y into a plurality of (e.g., 4-16) $\hat{y}$. The moving average amplitude may be calculated using $A_i = a * \hat{y}_i + (1-a) * A_{i-1}$, where a constant a may be equal to, for example, 0.1. The moving average amplitude may be then passed to the signal amplitude difference calculator to compute the signal amplitude difference using above-mentioned equation (1).

Figure 3:
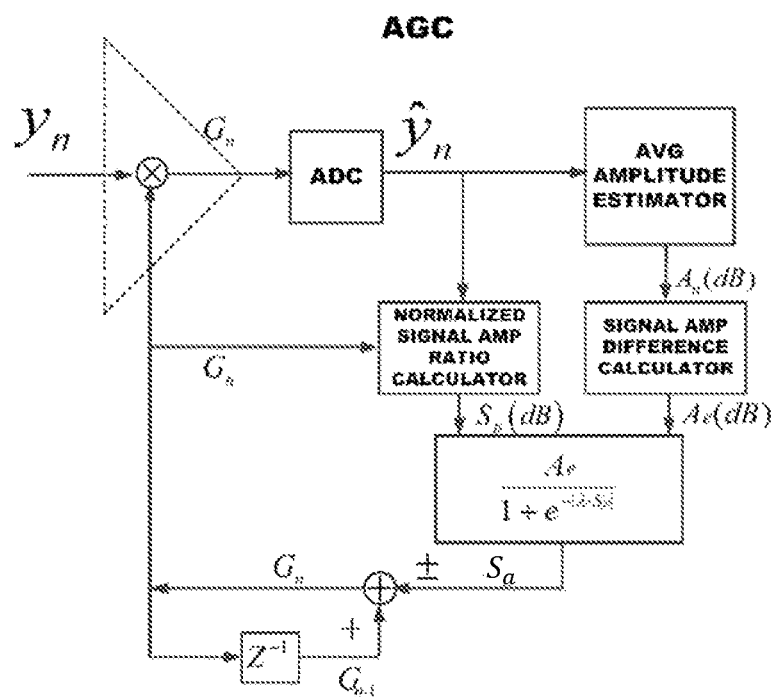
FIG. 3 depicts a block diagram of an exemplary hybrid automatic gain control (AGC) method according to various disclosed embodiments of the present disclosure.
Figure 4:
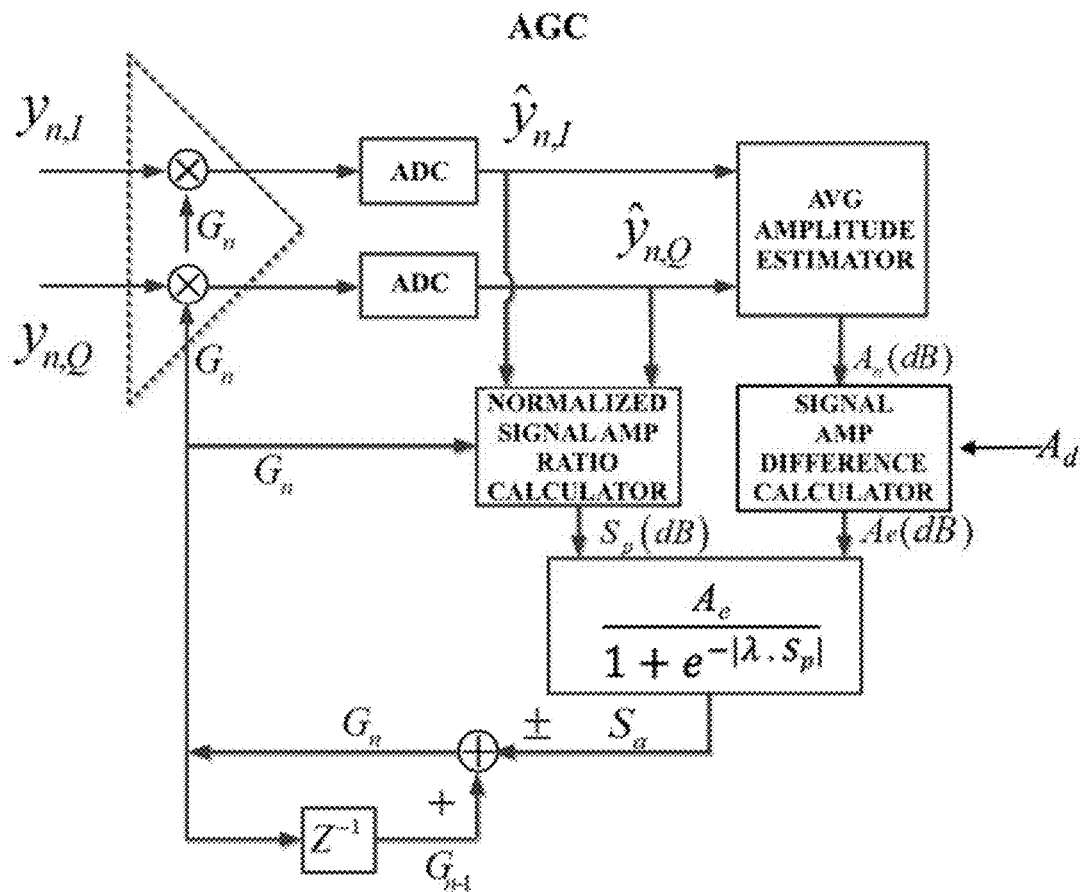
FIG. 4 depicts a block diagram of another exemplary hybrid automatic gain control (AGC) method according to various disclosed embodiments of the present disclosure.

FIG. 3 depicts a block diagram of an exemplary hybrid AGC method according to various disclosed embodiments of the present disclosure. The average amplitude estimator may calculate the average amplitude of the current input signal, the signal amplitude ratio calculator may generate the value of the signal amplitude ratio $S_p$, and the signal amplitude difference calculator may provide the value of the signal amplitude difference $A_e$. Then, the AGC gain may be calculated based on the step size derived from the above-mentioned equation (3) and a corresponding previous AGC gain. The first iteration $G_0$ may be selected to avoid the ADC saturation. FIG. 4 depicts a block diagram of another exemplary AGC method according to various disclosed embodiments of the present disclosure. Referring to FIG. 4, $Y_{n,I}$ and $Y_{n,Q}$ may be the imaginary and quadrature components of the input signal, and other description of this hybrid AGC method may refer to one embodiment shown in FIG. 3, which may not be described in detail herein.

According to various embodiments of the present disclosure, the evaluation of the AGC performance may include settling time and bit error rate (BER) in the system with and without AGC. The input may be quadrature phase shift keying (QPSK) modulated signals. The signal amplitude fluctuations may be included to simulate input signal amplitude variations and jamming. The AGC response and performance may be evaluated with respect to different noise levels. The benchmark of the feedback AGC methods, including a conventional feedback AGC method and an improved feedback AGC method, may be simulated and compared with the hybrid AGC method provided in various embodiments of the present disclosure.

Figure 5:
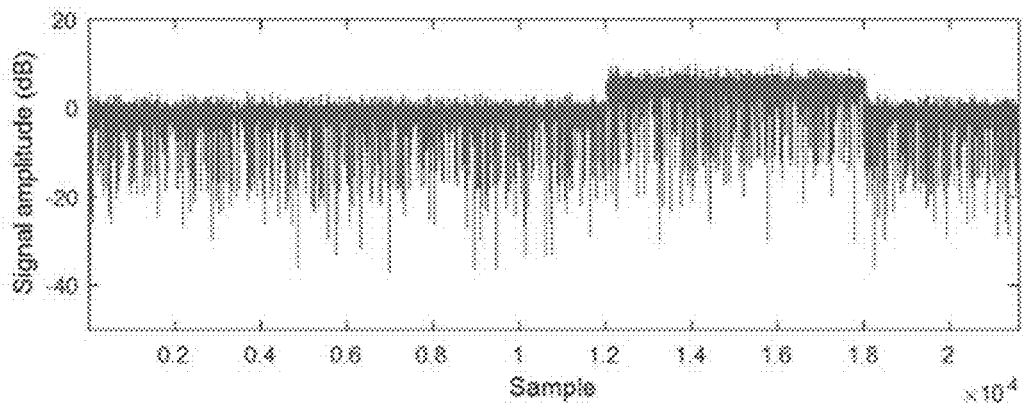
FIG. 5 depicts exemplary amplitudes of quadrature phase shift keying (QPSK) signals with distortions according to various disclosed embodiments of the present disclosure.

FIG. 5 depicts exemplary amplitudes of quadrature phase shift keying (QPSK) signals with distortions according to various disclosed embodiments of the present disclosure. Referring to FIG. 5, the signals without the distortions may have the average signal power to noise power ratio of 0 dB; and the distorted signal example may have one amplitude distortion without loss of generosity, which may simulate the case of the received signal with one large jamming distortion.

The system simulation parameters used for response time simulation are shown in the Table 1 below.

TABLE 1

| Parameters | Values |
| --- | --- |
| Eb/N0 | 10 dB |
| Total symbols | 104 |
| Samples/symbol | 8 |
| Sampling frequency | 15.36 MHz |
| Sampling time | 0.065 µs |
| Desired output signal power (e.g., amplitude) | 60 dB |

Figure 6:
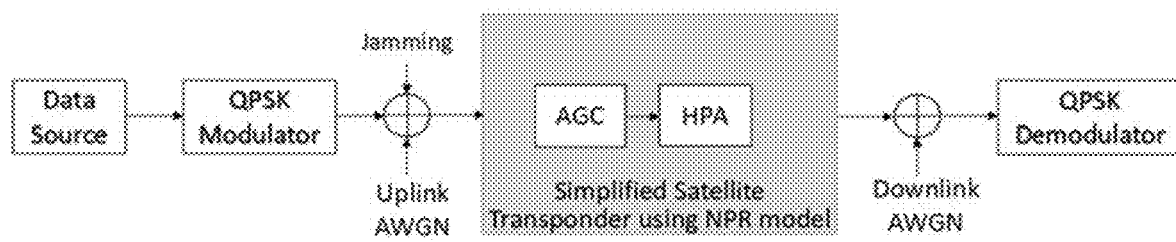
FIG. 6 depicts a block diagram of an exemplary simulation setup with a simplified satellite transponder model according to various disclosed embodiments of the present disclosure.

FIG. 6 depicts a block diagram of an exemplary simulation setup with a simplified satellite transponder model according to various disclosed embodiments of the present disclosure. Referring to FIG. 6, the block diagram may describe the simulation setup used to simulate the BER performance. The "bent-pipe" transponder may be adopted to convert uplink carrier frequencies to downlink carrier frequencies for information transmission without having on-board processing capability. The transponders equipped with high power amplifiers (HPAs), which are similar to amplifier modules in communication systems, may cause nonlinear distortions to transmitted signals, such that HPAs may be normally operated at or close to their saturation points to maximize power efficiency. The HPA saturated power may refer to the maximum output power capacity of the HPA. The AGC may be configured to control the input signals lies in the linear range of the HPA. The simulation setup may be designed especially for the comparison of above-mentioned three AGC methods. The desired power of the AGC may also be configured to be larger than the saturation point of the HPA to show how the nonlinearity affects the performance; and different scenarios may be used for evaluating the BER performance.

Besides the QPSK signal with single carrier frequency, the frequency hopping (FH) signal may also be selected as one of the tested input signals. FH is a method of transmitting signals by rapidly switching a carrier among various frequency channels, using a pseudorandom sequence known to both transmitter and receiver. Each available frequency band may be divided into sub-frequencies. Signals may rapidly change ("hop") among frequency channels in a predetermined order. The major advantage of FH may be to provide the anti-jamming capability, and the hybrid AGC method may handle the amplitude fluctuation caused by a fast hopping rate. Therefore, the frequency hopping signals may be tested with different AGC methods for the response time evaluation in various embodiments of the present disclosure.

Figure 7:
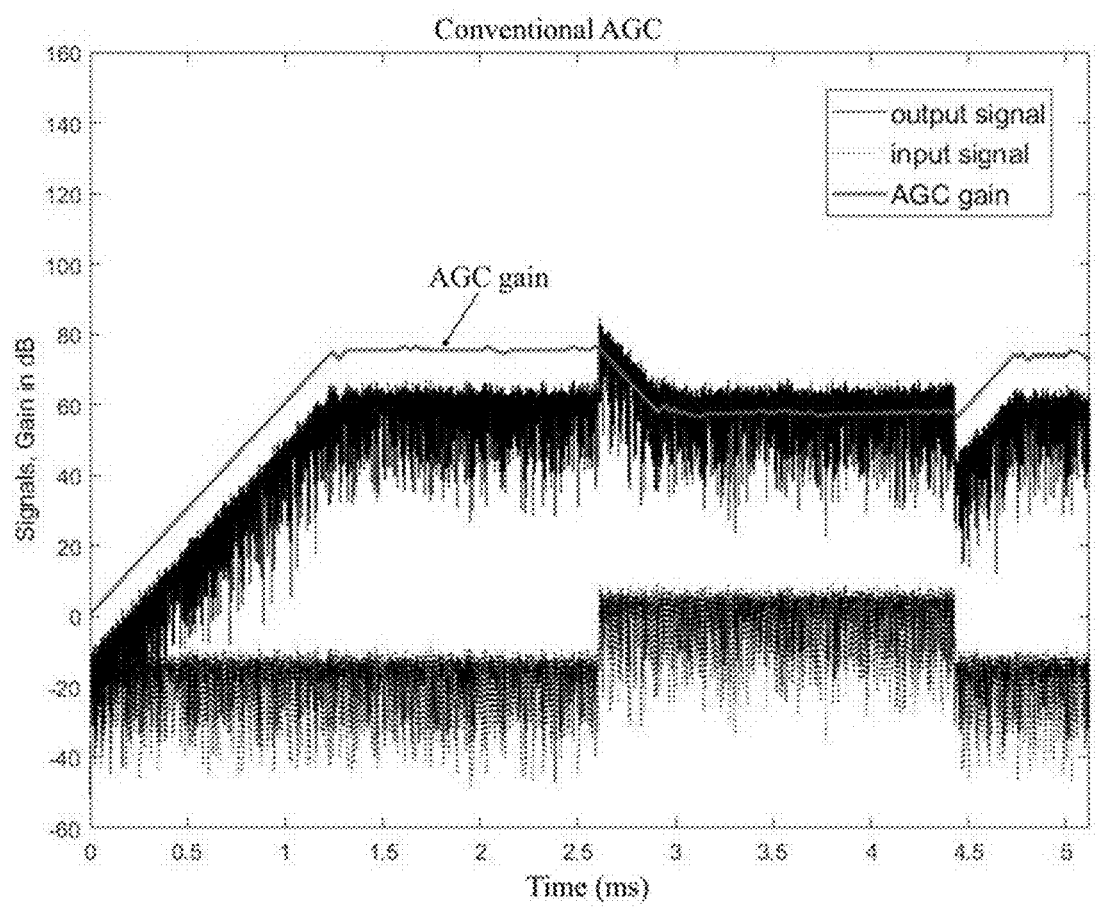
FIG. 7 depicts response time evaluation using an existing feedback automatic gain control (AGC) method.
Figure 8:
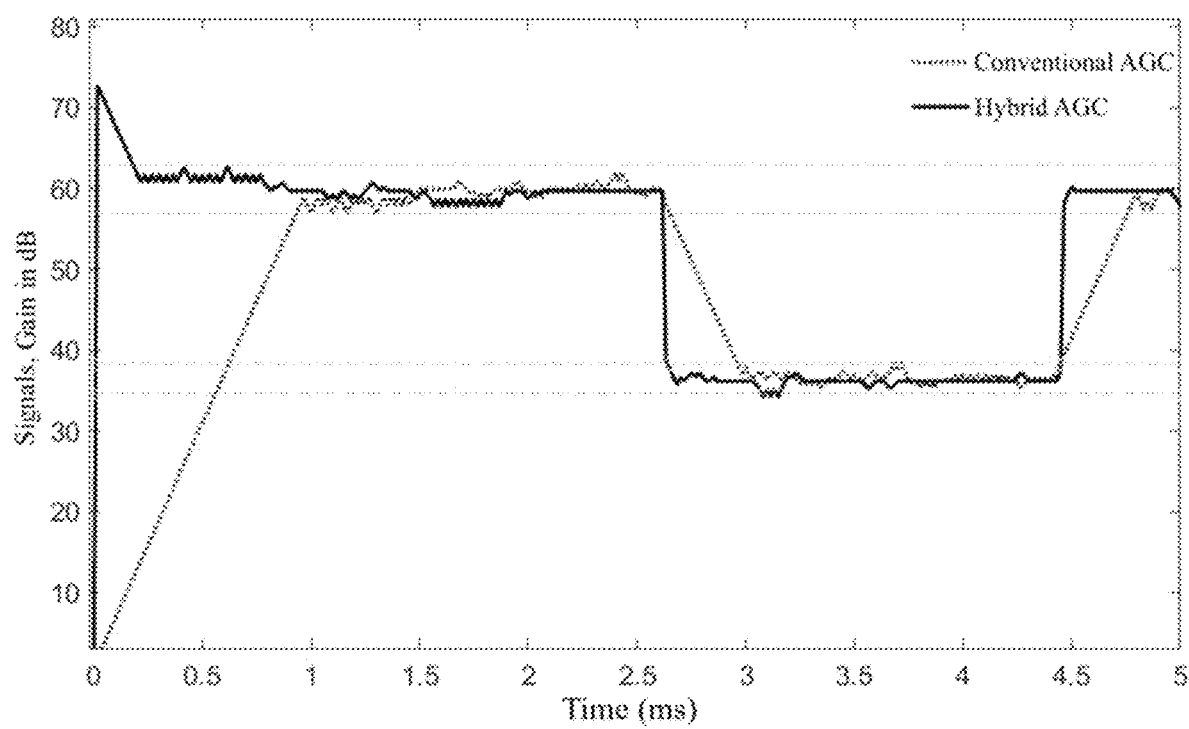
FIG. 8 depicts gain change comparison of three different automatic gain control (AGC) methods according to various disclosed embodiments of the present disclosure.

FIG. 7 depicts response time evaluation using an existing feedback AGC method. Referring to FIG. 7, the settling time may be evaluated with different AGC methods, and the conventional feedback AGC response may be shown in FIG. 7. As shown in FIG. 7, the AGC may provide a relatively constant desired output power range, for example, about 60 dB in one embodiment, by adjusting its gains for the input signal. FIG. 8 depicts gain change comparison of three different AGC methods according to various disclosed embodiments of the present disclosure. It should be noted that the hybrid feedback AGC method provided in various embodiments of the present disclosure may take shorter time than the benchmark methods to respond to the amplitude variations.

A numerical evaluation about the response time may also be conducted with same input signals and noise patterns. The jamming signal may cause the increase and decrease of the input signal power. Response time may be the time elapsed from the application of an ideal instantaneous step input to the time at which the system output has entered and remained within a specified error band. The time may be recorded when the response curves reach and stay within a range of certain percentage (about 5% or 2%) of the final value, where the 5% criterion may be taken as an example herein. The system parameters in 3-D simulation including convergence time of the AGC methods are summarized in Table 2. The performance index may be calculated by the ratio of the time difference with the converge time of the conventional AGC method. By using the hybrid feedback AGC method provided in various embodiments of the present disclosure, the step down and step up convergence time may both be improved significantly comparing with the conventional feedback AGC method. The performance improvement index may be about 80.3% and 72.7% for step down and step up, respectively.

TABLE 2

| Control Methods | Step down convergence time (ms) | Step up convergence time (ms) |
| --- | --- | --- |
| Conventional feedback AGC method | 0.395 | 0.33 |
| Hybrid AGC method | 0.078 | 0.09 |
| Feedforward AGC method | 0.26 | 0.31 |

The BER performance comparison of the above-mentioned AGC methods have been provided to better illustrate the difference between the AGC methods.

Figure 9:
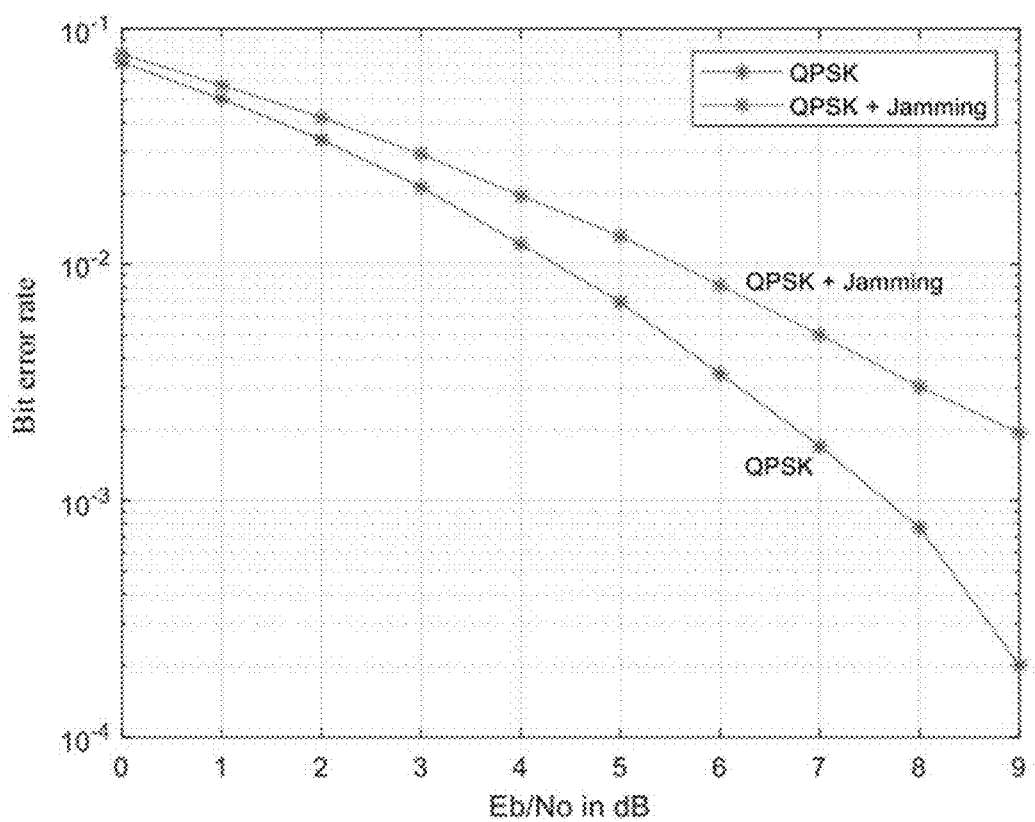
FIG. 9 depicts a bit error rate (BER) performance comparison diagram according to various disclosed embodiments of the present disclosure.

The simulation results without AGC may be shown first. The regular case may include the input QPSK signal, a AWGN channel, and a simplified transponder model with HPA. Then, the results may be compared to the case with the jamming signal. FIG. 9 depicts a BER performance comparison diagram according to various disclosed embodiments of the present disclosure. The BER results of regular QPSK signals and signals with jamming added are illustrated in FIG. 9. It should be noted that when the jamming signal is existed, the error rate of the system may increase since the jamming signal can deteriorate the system performance.

The parameters listed in Table 3 are used to derive the BER performance of the regular QPSK signal, the QPSK signal with jamming, and the jammed QPSK signal with an AGC module.

TABLE 3

| QPSK simulation parameters | | |
| --- | --- | --- |
| Samples/bit | Sampling frequency | Sampling time |
| 4 | 4 MHz | 0.25 µs |
| AGC Parameters | | |
| Desired signal output power (e.g., amplitude) | Step size | Average window size |
| 1 Watt | 0.5 | 10 |

Figure 10:
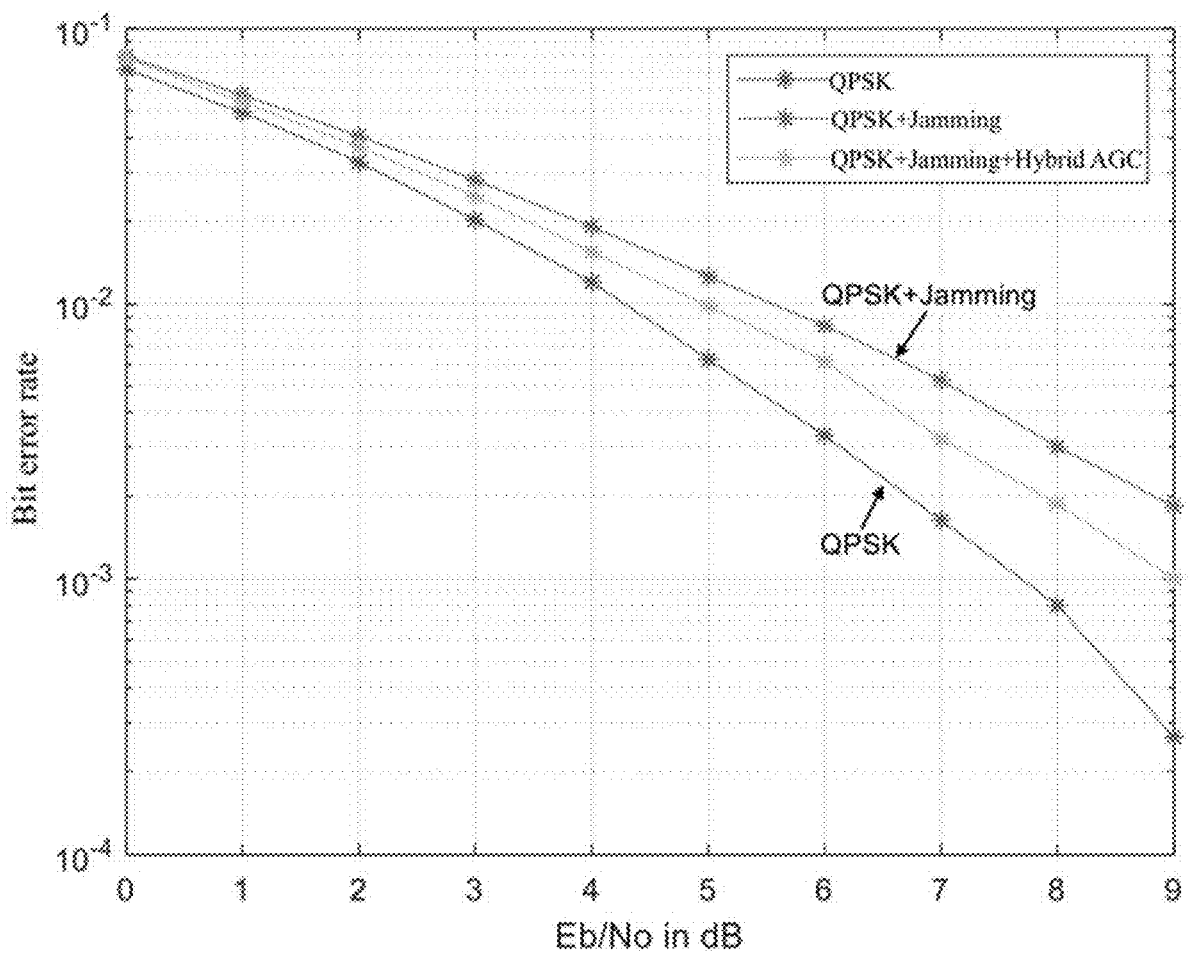
FIG. 10 depicts another bit error rate (BER) performance comparison diagram according to various disclosed embodiments of the present disclosure.

FIG. 10 depicts another BER performance comparison diagram according to various disclosed embodiments of the present disclosure. Referring to FIG. 10, it should be noted that when the jamming signal exists, the system with the hybrid AGC may provide better error performance by avoiding the HPA saturation.

Figure 11:
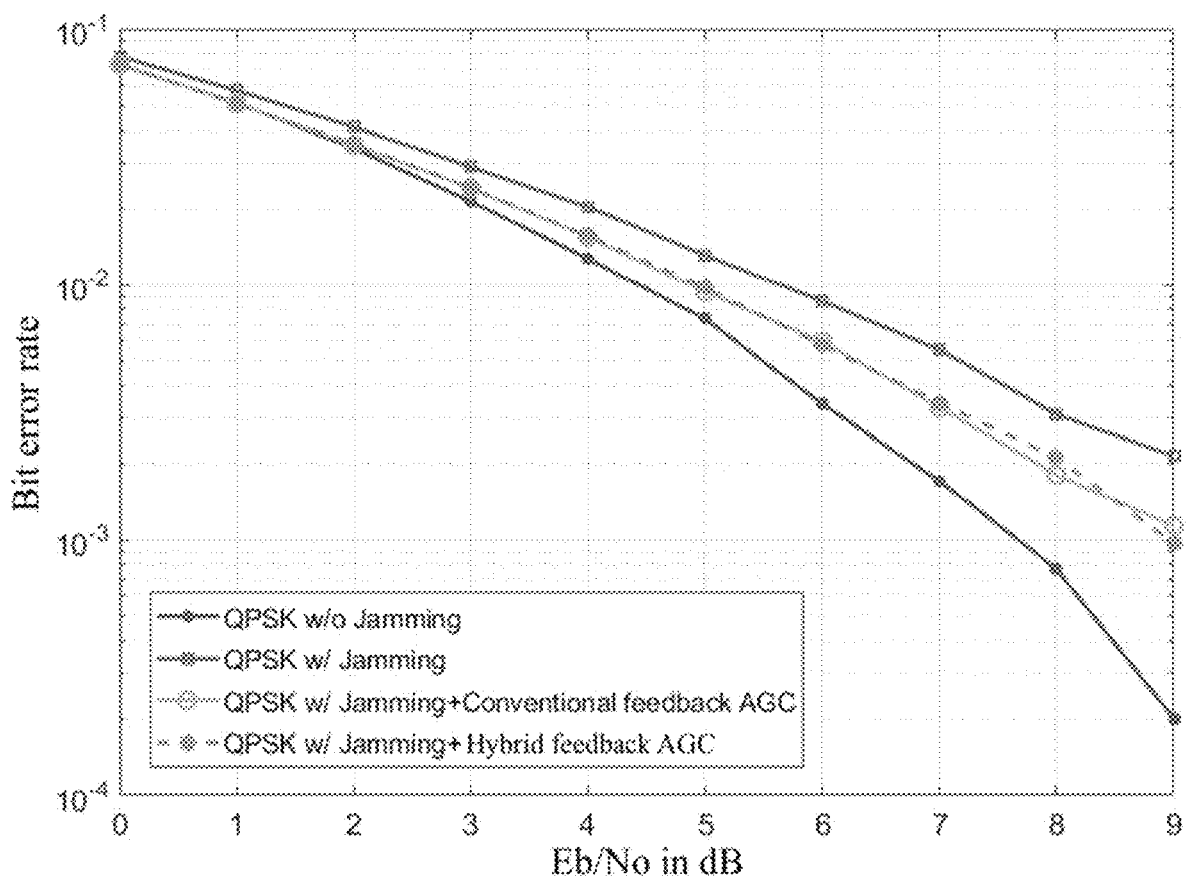
FIG. 11 depicts another bit error rate (BER) performance comparison diagram according to various disclosed embodiments of the present disclosure.

Furthermore, the simulation results may be elaborated in terms of the system BER performance with three different AGC methods, including the conventional feedback AGC method, the improved feedback AGC method, and the exemplary hybrid AGC method provided in various embodiments of the present disclosure. FIG. 11 depicts another BER performance comparison diagram according to various disclosed embodiments of the present disclosure. It should be noted that the three AGC methods may provide similar performance in terms of BER. However, the hybrid AGC method may have the smallest settling time comparing with other two methods.

The hybrid feedback AGC method may be provided in various embodiments of the present disclosure, and different AGC methods may be evaluated for the performance verification. Quantified performance evaluations such as response time and BER evaluation have been used to evaluate the simulation performance. The simulated results may show that the hybrid feedback AGC may have the lowest response time with comparable BER performance under the simplified transponder model.

According to various embodiments of the present disclosure, the hybrid AGC method may combine the signal amplitude ratio technique and the signal amplitude difference technique. The hybrid AGC method may be robust to different input signal amplitude variations and is applicable to other systems besides SATCOM systems. The hybrid AGC method may maintain the input signal within the desired range in the conditions of jamming with shorter response time compared to conventional AGC method.

Various embodiments of the present disclosure further provide a hybrid automatic gain control (AGC) device. The device includes a memory, configured to store program instructions for performing a hybrid automatic gain control method; and a processor, coupled with the memory and, when executing the program instructions, configured for: amplifying, by a variable gain amplifier, an input signal received from a transmitter to generate an amplified signal, and converting the amplified signal into a plurality of output signals; obtaining, by an average amplitude estimator, a moving average amplitude of a plurality of output signals of a current input signal; and calculating, by a signal amplitude difference calculator, a signal amplitude difference according to the moving average amplitude of the plurality of output signals of the current input signal and a desired output signal amplitude level; calculating, by a normalized signal amplitude ratio calculator, a signal amplitude ratio according to a plurality of output signals of two previous output signal blocks and AGC gains corresponding to the plurality of output signals of the two previous output signal blocks, where the two previous output signal blocks correspond to two previous consecutive input signals together next to the current input signal; obtaining a step size according to the signal amplitude difference and the signal amplitude ratio; and calculating an AGC gain of the current input signal according to the step size and a corresponding previous AGC gain.

Various embodiments of the present disclosure further provide a non-transitory computer-readable storage medium, containing program instructions for, when being executed by a processor, performing a hybrid automatic gain control (AGC) method, the method including: amplifying, by a variable gain amplifier, an input signal received from a transmitter to generate an amplified signal, and converting the amplified signal into a plurality of output signals; obtaining, by an average amplitude estimator, a moving average amplitude of a plurality of output signals of a current input signal; and calculating, by a signal amplitude difference calculator, a signal amplitude difference according to the moving average amplitude of the plurality of output signals of the current input signal and a desired output signal amplitude level; calculating, by a normalized signal amplitude ratio calculator, a signal amplitude ratio according to a plurality of output signals of two previous output signal blocks and AGC gains corresponding to the plurality of output signals of the two previous output signal blocks, where the two previous output signal blocks correspond to two previous consecutive input signals together next to the current input signal; obtaining a step size according to the signal amplitude difference and the signal amplitude ratio; and calculating an AGC gain of the current input signal according to the step size and a corresponding previous AGC gain.

It should be understood that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. In certain cases, the numerical values as stated for the parameter can take on negative values.

Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

What is claimed is:

1. A hybrid automatic gain control (AGC) method, comprising:
    amplifying, by a variable gain amplifier, an input signal received from a transmitter to generate an amplified signal, and converting, by one or more analog-to-digital converters, the amplified signal into a plurality of output signals;
    estimating, by an average amplitude estimator, a moving-average amplitude of output signals of a currently-received input signal; and calculating, by a signal amplitude difference calculator, a signal amplitude difference according to the moving-average amplitude of the plurality of output signals of the currently-received input signal and a desired output signal amplitude level;
    calculating, by a normalized signal amplitude ratio calculator, a signal amplitude ratio according to output signals of two previous output signal blocks and AGC gains corresponding to the output signals of the two previous output signal blocks, wherein the two previous output signal blocks correspond to two previous consecutive input signals next to the currently-received input signal;
    obtaining a step size according to the signal amplitude difference and the signal amplitude ratio; and
    calculating an AGC gain of the currently-received input signal according to the step size and an AGC gain of a previous input signal adjacent to the currently-received input signal.

2. The method according to claim 1, wherein the signal amplitude difference is expressed by:

$$A_e = A_n - A_d$$

wherein $A_e$ denotes the signal amplitude difference, $A_n$ denotes the moving-average amplitude and $A_d$ denotes the desired output signal amplitude level.

3. The method according to claim 2, wherein the signal amplitude ratio is expressed by:

$$S_p = \sum_{i=1}^{\beta} \left| \frac{\hat{y}_{n-\beta-i}}{G_{n-\beta-i}} \right| / \sum_{i=1}^{\beta} \left| \frac{\hat{y}_{n-i}}{G_{n-i}} \right|$$

wherein $S_p$ denotes the signal amplitude ratio, $\hat{y}$ denotes an output signal, G denotes an AGC gain, n denotes a signal index, $\beta$ denotes a size of an output signal block, and i denotes an index within the output signal block.

4. The method according to claim 3, wherein the step size is expressed by:

$$S_a = \frac{A_e}{1 + e^{-|\lambda S_p|}}$$

wherein $S_a$ denotes the step size, and $\lambda$ denotes a scale factor.

5. The method according to claim 3, wherein:
    the size of the output signal block is an integral multiple of a quantity of the plurality of output signals of the currently-received input signal.

6. A hybrid automatic gain control (AGC) device, comprising:
    a memory, configured to store program instructions for performing a hybrid automatic gain control method; and a processor, coupled with the memory and, when executing the program instructions, configured for:
amplifying, by a variable gain amplifier, an input signal received from a transmitter to generate an amplified signal, and converting, by one or more analog-to-digital converters, the amplified signal into a plurality of output signals;
estimating, by an average amplitude estimator, a moving-average amplitude of a plurality of output signals of a currently-received input signal; and calculating, by a signal amplitude difference calculator, a signal amplitude difference according to the moving-average amplitude of the plurality of output signals of the currently-received input signal and a desired output signal amplitude level;
calculating, by a normalized signal amplitude ratio calculator, a signal amplitude ratio according to output signals of two previous output signal blocks and AGC gains corresponding to the output signals of the two previous output signal blocks, wherein the two previous output signal blocks correspond to two previous consecutive input signals next to the currently-received input signal;
obtaining a step size according to the signal amplitude difference and the signal amplitude ratio; and
calculating an AGC gain of the currently-received input signal according to the step size and an AGC gain of a previous input signal adjacent to the currently-received input signal.

7. The device according to claim 6, wherein the signal amplitude difference is expressed by:

$$A_e = A_n - A_d$$

wherein $A_e$ denotes the signal amplitude difference, $A_n$ denotes the moving-average amplitude and $A_d$ denotes the desired output signal amplitude level.

8. The device according to claim 7, wherein the signal amplitude ratio is expressed by:

$$S_p = \sum_{i=1}^{\beta} \left|\frac{\hat{y}_{n-\beta-i}}{G_{n-\beta-i}}\right| / \sum_{i=1}^{\beta} \left|\frac{\hat{y}_{n-i}}{G_{n-i}}\right|$$

wherein $S_p$ denotes the signal amplitude ratio, $\hat{y}$ denotes an output signal, G denotes an AGC gain, n denotes a signal index, $\beta$ denotes a size of an output signal block, and i denotes an index within the output signal block.

9. The device according to claim 8, wherein the step size is expressed by:

$$S_a = \frac{A_e}{1 + e^{-|\lambda S_p|}}$$

wherein $S_a$ denotes the step size, and $\lambda$ denotes a scale factor.

10. The device according to claim 8, wherein:
the size of the output signal block is an integral multiple of a quantity of the plurality of output signals of the currently-received input signal.

11. A non-transitory computer-readable storage medium, containing program instructions for, when being executed by a processor, performing a hybrid automatic gain control (AGC) method, the method comprising:
amplifying, by a variable gain amplifier, an input signal received from a transmitter to generate an amplified signal, and converting, by one or more analog-to-digital converters, the amplified signal into a plurality of output signals;
estimating, by an average amplitude estimator, a moving-average amplitude of output signals of a currently-received input signal; and calculating, by a signal amplitude difference calculator, a signal amplitude difference according to the moving-average amplitude of the plurality of output signals of the currently-received input signal and a desired output signal amplitude level;
calculating, by a normalized signal amplitude ratio calculator, a signal amplitude ratio according to output signals of two previous output signal blocks and AGC gains corresponding to the output signals of the two previous output signal blocks, wherein the two previous output signal blocks correspond to two previous consecutive input signals next to the currently-received input signal;
obtaining a step size according to the signal amplitude difference and the signal amplitude ratio; and
calculating an AGC gain of the currently-received input signal according to the step size and an AGC gain of a previous input signal adjacent to the currently-received input signal.

12. The storage medium according to claim 11, wherein the signal amplitude difference is expressed by:

$$A_e = A_n - A_d$$

wherein $A_e$ denotes the signal amplitude difference, $A_n$ denotes the moving-average amplitude and $A_d$ denotes the desired output signal amplitude level.

13. The storage medium according to claim 12, wherein the signal amplitude ratio is expressed by:

$$S_p = \sum_{i=1}^{\beta} \left|\frac{\hat{y}_{n-\beta-i}}{G_{n-\beta-i}}\right| / \sum_{i=1}^{\beta} \left|\frac{\hat{y}_{n-i}}{G_{n-i}}\right|$$

wherein $S_p$ denotes the signal amplitude ratio, $\hat{y}$ denotes an output signal, G denotes an AGC gain, n denotes a signal index, $\beta$ denotes a size of an output signal block, and i denotes an index within the output signal block.

14. The storage medium according to claim 13, wherein the step size is expressed by:

$$S_a = \frac{A_e}{1 + e^{-|\lambda S_p|}}$$

wherein $S_a$ denotes the step size, and $\lambda$ denotes a scale factor.

15. The storage medium according to claim 13, wherein:
the size of the output signal block is an integral multiple of a quantity of the plurality of output signals of the currently-received input signal.

* * * * *